(12) United States Patent
Onorato et al.

(10) Patent No.: US 7,960,945 B1
(45) Date of Patent: Jun. 14, 2011

(54) ESTIMATING REMAINING USE TIME OF A MOBILE DEVICE

(75) Inventors: Joseph M. Onorato, Cambridge, MA (US); Andy Rubin, Los Altos Hills, CA (US)

(73) Assignee: Google Inc., Mountain View, CA (US)

( * ) Notice: Subject to any disclaimer, the term of this patent is extended or adjusted under 35 U.S.C. 154(b) by 794 days.

(21) Appl. No.: 12/022,656

(22) Filed: Jan. 30, 2008

(51) Int. Cl.
*H01M 10/44* (2006.01)
*H01M 10/46* (2006.01)

(52) U.S. Cl. ...................................................... 320/132

(58) Field of Classification Search ................. 320/107, 320/112, 114, 132, 149, DIG. 21; 324/426, 324/427, 433
See application file for complete search history.

(56) References Cited

U.S. PATENT DOCUMENTS 4,876,513 A * 10/1989 Brilmyer et al. ............... 324/427
6,300,763 B1 * 10/2001 Kwok ........................... 324/427

* cited by examiner

*Primary Examiner* — Edward Tso
(74) *Attorney, Agent, or Firm* — Fish & Richardson P.C.

(57) ABSTRACT

The present disclosure provides methods and systems for estimating the remaining use time of a battery of a mobile device. In some implementations, the method includes providing a use profile programmed in a memory of the mobile device, and monitoring a rate of change of a state of charge (SOC) of the battery. The rate of change of the SOC and the use profile are processed to affect a comparison therebetween, and the remaining use time is estimated based on the comparison.

25 Claims, 7 Drawing Sheets

| Usage Category | Discharge Rate (dSOC/dt) | Use Profile - NORM (%) | Use Profile - TRAV (%) |
|---|---|---|---|
| Telephone | $X_{TEL}$ | $UP_{NTEL}$ | $UP_{TTEL}$ |
| Email | $X_{EMAIL}$ | $UP_{NEMAIL}$ | $UP_{TEMAIL}$ |
| Internet Browser | $X_{IB}$ | $UP_{NIB}$ | $UP_{TIB}$ |
| Internet Video | $X_{IV}$ | $UP_{NIV}$ | $UP_{TIV}$ |
| Internet Audio | $X_{IA}$ | $UP_{NIA}$ | $UP_{TIA}$ |
| Video | $X_{VID}$ | $UP_{NVID}$ | $UP_{TVID}$ |
| Audio | $X_{AUD}$ | $UP_{NAUD}$ | $UP_{TAUD}$ |
| Text Messaging | $X_{TM}$ | $UP_{NTM}$ | $UP_{TTM}$ |
| Instant Messaging | $X_{IM}$ | $UP_{NIM}$ | $UP_{TIM}$ |
| Standby | $X_{SBY}$ | $UP_{NSBY}$ | $UP_{TSBY}$ |
| Standby-Active | $X_{SBA}$ | $UP_{NSBA}$ | $UP_{TSBA}$ |
| Off | $X_{OFF}$ | $UP_{NOFF}$ | $UP_{TOFF}$ |
| TOTAL | | 100% | 100% |

FIG. 1

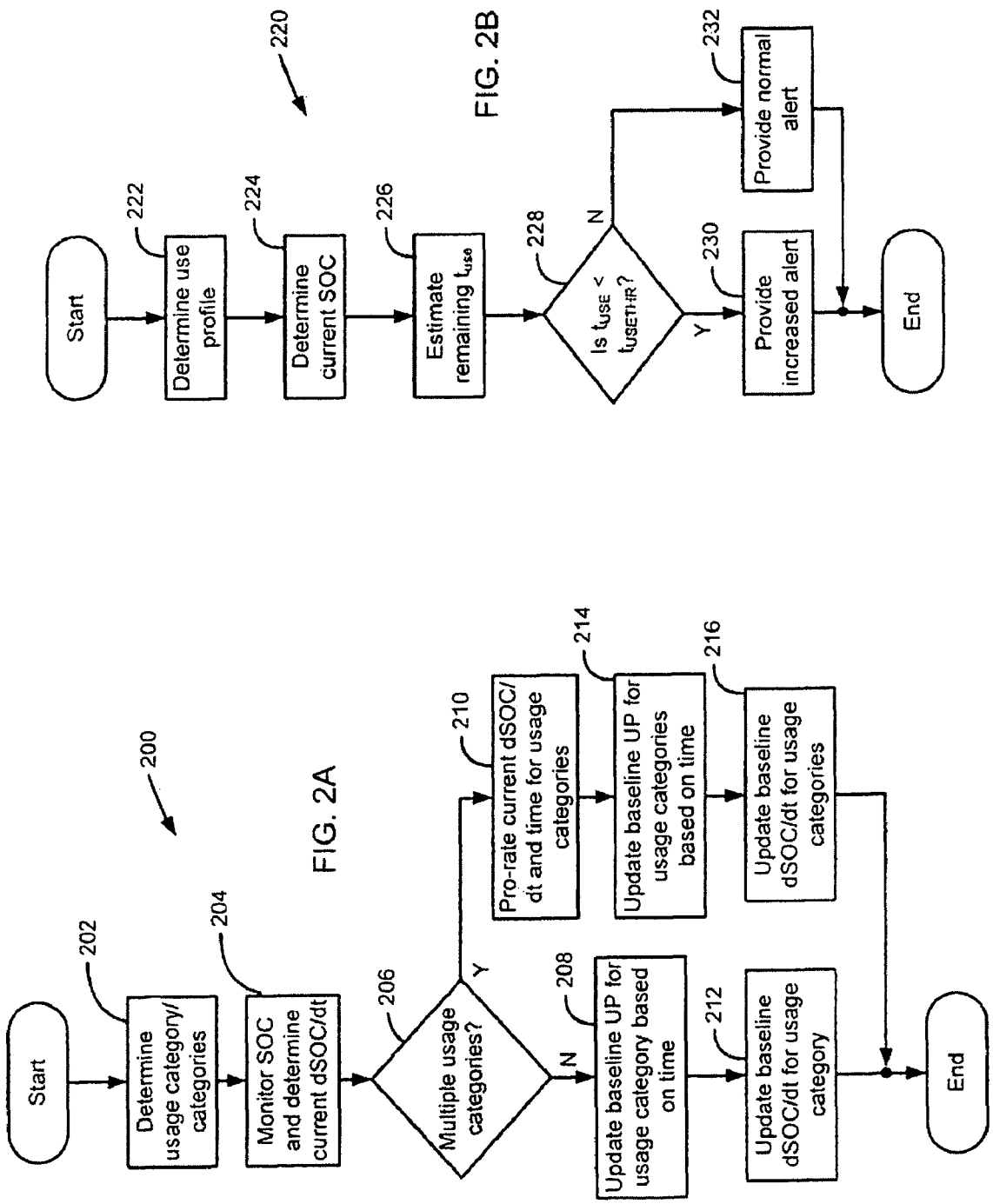

ESTIMATING REMAINING USE TIME OF A MOBILE DEVICE

TECHNICAL FIELD

This disclosure relates to methods and systems for power management in mobile devices, and more particularly to estimating the remaining use time of a mobile device.

BACKGROUND

As the quantity of available information on computer networks has increased, and as users have become accustomed to accessing this information through fixed computing devices (such as a desktop personal computer permanently connected to an appropriately provisioned network) and laptop computing devices (having either a wired or wireless connection to a network), users have demanded access to the same information through their mobile devices. Specifically, users now expect to be able to access stock quotes, baseball scores, restaurant listings and the like, including accurate network search results, from their mobile devices. Accordingly, handheld mobile devices, such as cellular telephones and personal digital assistants (PDAs), are becoming increasingly powerful both in terms of processing power and the ability to provide access to data. Such portable devices are also integrating additional features. For example, many portable devices also function as portable music and/or video players, which can record, store and replay music and video content.

Portable devices generally include a battery, which provides power when the portable device is not directly connected to a power source. Advances in battery technology have extended the battery life. However, the increased demands on the portable devices such as computing devices, information terminals, portable music and/or video players, and the like, have correspondingly increased the power demand from the battery.

SUMMARY

This document discloses methods, techniques, and systems for estimating the remaining use time of a mobile device. In some implementations, the methods include providing a use profile programmed in a memory of the mobile device, and monitoring a rate of change of a state of charge (SOC) of the battery. The rate of change of the SOC and the use profile are processed to affect a comparison therebetween, and the remaining use time is estimated based on the comparison.

In some implementations, a usage category of the mobile device corresponding to the use profile, and the rate of change of the SOC associated with the usage category are determined. An amount of time that the mobile device is operating in the usage category is calculated, and a baseline use percentage value of the usage category is updated based on the rate of change of the SOC and the amount of time. The baseline use percentage value can be updated based on prorated rate of change of the SOC values, when the mobile device is operating in concurrent usage categories.

In other implementations, the remaining use time is compared to a threshold time, and a normal alert is provided when the remaining use time is greater than the threshold time. An increased alert can be provided when the remaining use time is not greater than the threshold time.

In still other implementations, the use profile is selected from a plurality of use profiles. Use of the mobile device can be monitored, and the use profile can be automatically selected by the mobile device based on the use of the mobile device. Alternatively, or in addition thereto, the use profile can be selected based on a user input.

The details of one or more implementations are set forth in the accompanying drawings and the description below. Other features, objects, and advantages will be apparent from the description and drawings, and from the claims.

DESCRIPTION OF DRAWINGS

FIG. 1 illustrates an exemplary use profile table that maps the usage of a mobile device.

FIG. 2A is a flowchart illustrating exemplary steps that can be executed to update a use profile of a mobile device.

FIG. 2B is a flowchart illustrating exemplary steps that can be executed to alert a user of the remaining usage time of the mobile device.

Like reference symbols in the various drawings indicate like elements.

DETAILED DESCRIPTION

Figure 3:
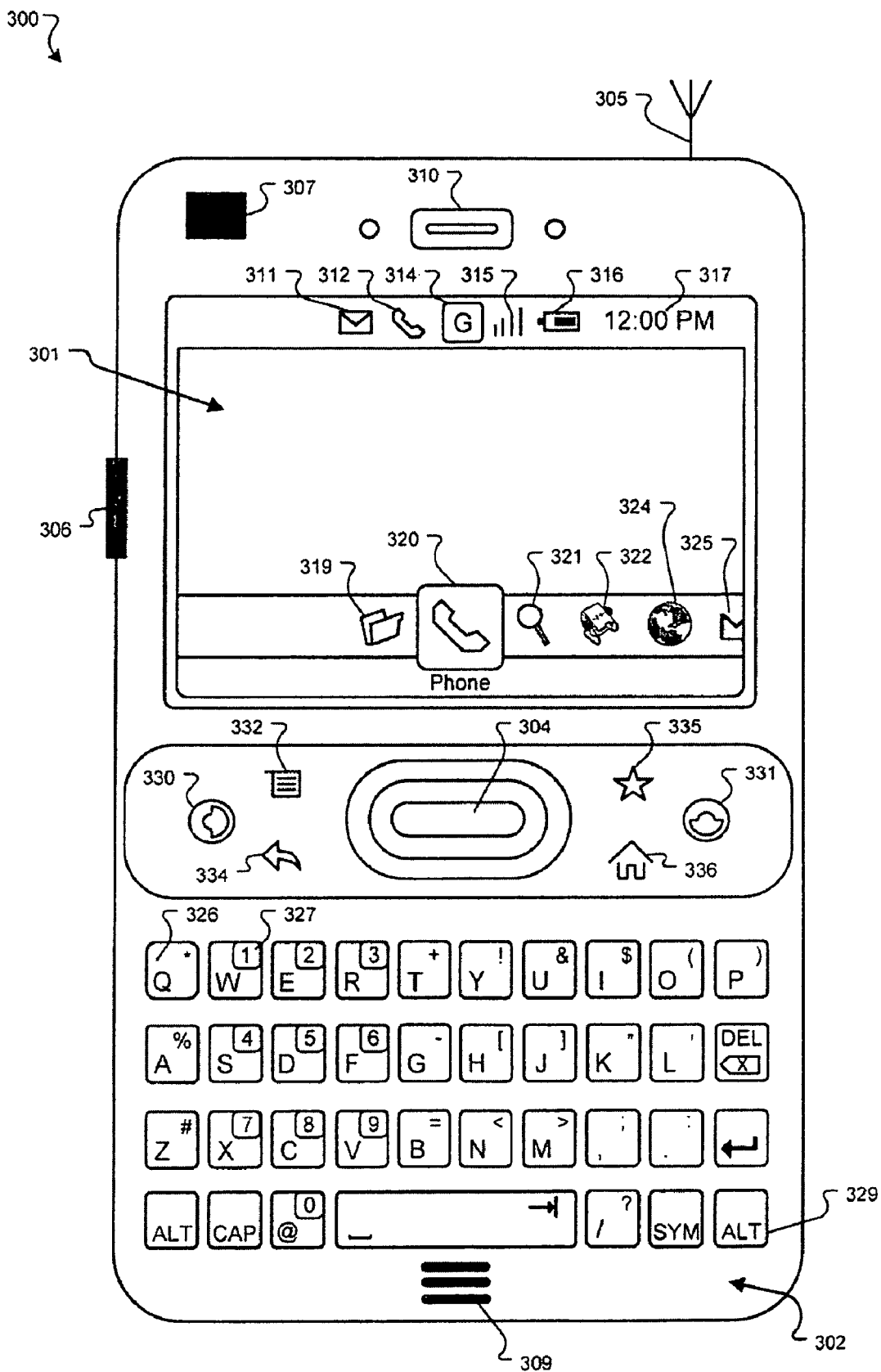
FIG. 3 is a schematic representation of an exemplary mobile device that uses implementations of the usage time estimating and alerting described herein.

In various implementations, methods, techniques, and systems for estimating the remaining usage time of a portable device are described herein. As described in further detail below, the state of charge (SOC) of a battery of a mobile device and the rate of change of the SOC are intermittently monitored. The SOC of a battery indicates the amount of usable energy stored within the battery at a given time. More specifically, the SOC is the battery's available capacity expressed as a percentage of its rated capacity. By monitoring the amount of energy left in the battery compared with the energy it had when it was most recently recharged, as well as the rate of change of the SOC, an indication of how much longer a battery will continue to perform before it needs recharging can be provided. Once the SOC falls below a threshold level, the battery is no longer able to sufficiently power the mobile device and the mobile device may be deactivated.

The SOC of the battery can be determined using various methods. In some exemplary methods, the voltage and/or current of the battery can be intermittently measured and the SOC can be determined based thereon. When using the voltage of the battery as the basis for determining the SOC, the results can vary depending on actual voltage level, the battery temperature, the discharge rate and the age of the battery. Compensation for these factors should be provided to achieve an accurate SOC value. The current entering and leaving the battery can serve as a basis for determining the SOC. The charge transferred in or out of the battery is obtained by accumulating the current drain over time, which is known as Coulomb counting. As with voltage monitoring, compensation for other operating conditions is required to provide an accurate SOC value.

In one exemplary method, the SOC of the battery can be determined from a look-up table or multiple look-up tables stored in a memory of the mobile device. The look-up table(s) can be empirically derived for the particular battery, and can consider other factors that may affect the SOC of the battery. The monitored voltage and/or current can be used as inputs to the look-up table, and the SOC can be determined based thereon. In another exemplary method, the SOC of the battery can be determined from a formula that is processed within a processor of the mobile device. The formula can be a mathematical representation, or model, of the battery, and can be empirically developed to consider other factors that may affect the SOC of the battery. The monitored voltage and/or current values can be processed through the voltage, and the SOC determined based thereon.

Regardless of the actual method implemented for determining the SOC, the methods and systems described herein monitor the rate of change of the SOC during use of the mobile device. The rate of change of the SOC (hereinafter dSOC/dt) will vary based on the particular energy demands at a given time. A mobile device, such as that described in further detail below, can perform various functions that can be classified into usage categories. Exemplary usage categories include, but are not limited to, a telephone, an email terminal, an Internet browser, a video player, an audio player, a text messaging portal, an instant messaging portal and/or a global positioning system (GPS) portal. When functioning as an Internet browser, the mobile device can be used to provide streaming video and/or audio through the Internet connection. Other usage categories include, but are not limited to, standby and OFF. When operating in the standby usage category, the mobile device is powered ON, but is not being actively operated by a user.

Other usage categories are also anticipated within the scope of the present disclosure. In a standby-active usage category, the mobile device can execute functions on the user's behalf even though the user isn't interacting with the mobile device. For example, the mobile device can synchronize data in the background, pre-fetch web pages, and the like, without user interaction. From the user's point of view, the mobile device is operating in standby, but in the standby-active usage category, a different power profile is provided than that of the standby usage category.

A use profile, or multiple use profiles can be developed and stored in a memory of the mobile device. The use profile profiles the battery consumption of the mobile device in terms of dSOC/dt as a function of the usage category. The use profile maps the use of the mobile device using percentages of how often the mobile device operates in a particular usage category. A number of usage categories can be defined for a particular mobile device based on the particular configuration of the mobile device. For example, if the mobile device is not configured with a GPS receiver, the mobile device can not function as a GPS portal. Accordingly, the use profile of that mobile device will either not include a GPS usage category or will be rated as 0%, for example, for that usage category.

Referring now to FIG. 1, an exemplar table 100 illustrates multiple usage categories 102, dSOC/dt values (X) 104 for each usage category, an exemplar normal use profile (NORM) 106, and an exemplar traveling use profile (TRAV) 108. Although two use profiles are described herein, it is anticipated that other implementations of the present disclosure can use fewer or more use profiles. The normal use profile includes percentage values ($UP_N$), each of which is associated with a particular usage category. The travel use profile includes percentage values ($UP_T$), each of which is associated with a particular usage category.

The normal use profile represents the typical usage of the mobile device for the particular user. During normal use, the amount of remaining usage time can be determined based on the normal use profile and the corresponding discharge rates. If, for some reason, the user deviates from the normal use profile, an alert can be generated to inform the user that the remaining usage time (i.e., the remaining time before the SOC of the battery is too low to operate the mobile device) is shorter or longer than the user would typically anticipate. For example, if the user is using the mobile device more often and/or in usage categories with higher rates of discharge than normal, the mobile device will alert the user that the battery will not last as long as the user may be accustomed to.

The travel use profile represents the typical usage of the mobile device, while the particular user is traveling. For example, a user may use his/her mobile device more often for calls, email, Internet access, or other reasons while traveling. Accordingly, the user can manually switch between use profiles as desired, by selecting a desired use profile on the mobile device. In other implementations, the mobile device can automatically switch between use profiles. For example, if the monitored usage time for usage categories differ from that of the currently selected use profile, the mobile device can switch to another use profile. In some implementations, the difference in usage times must be greater than a threshold difference. It is also anticipated that the mobile device can alert the user that the use profile has changed or will be changed, and the user can accept or deny the change.

In one implementation, an initial normal use profile can be pre-programmed in the memory of the mobile device, and can be updated based on the usage habits of the particular user. As described in further detail below, the amount of time that the mobile device is operating in a particular usage category, relative to the overall usage time of the mobile device, can be monitored and the percentage value is updated based thereon. In other implementations, an initial travel use profile can be pre-programmed in the memory of the mobile device, and can be updated based on the usage habits of the particular user. The initial travel use profile can be the same as the initial normal use profile, or can deviate therefrom, to be more reflective of how the mobile device may be typically used when the user is traveling. Furthermore, the baseline dSOC/dt value assigned to each usage category can vary over time. Accordingly, the dSOC/dt value for each category can be monitored and the baseline values for the current or active profile can be updated based thereon.

Referring now to FIG. 2A, a flowchart illustrates an exemplary process 200 for updating the current use profile. That is, the use profile currently active on the mobile device. In step 202, the current usage category is determined, or categories in the case of concurrent uses (e.g., typing an email, while talking on speakerphone). In step 204, the SOC is monitored and the current dSOC/dt is determined based thereon. In step 206, it is determined whether multiple usage categories are being concurrently used. If multiple usage categories are not being concurrently used, the process 200 continues at step 208. If multiple usage categories are being concurrently used, the process 200 continues at step 210.

In step 208, the baseline use percentage (UP) for the single usage category is updated based on the monitored amount of time that the mobile device has been operating in the usage category. In step 212, the baseline dSOC/dt for the usage category is updated based on the monitored dSOC/dt, and the process 200 ends. In step 210, the determined dSOC/dt and the monitored amount of time that the mobile device has been operating in the multiple usage categories are pro-rated for the usage categories. The baseline UP for each usage category is updated based on the pro-rated time in step 214. In step 216, the baseline dSOC/dt is updated for each of the usage categories, and the process 200 ends.

Referring now to FIG. 2B, a flowchart illustrates an exemplar process 220 for monitoring the remaining usage time ($t_{USE}$) of the battery. In step 222, the current use profile is determined. In step 224, the current SOC of the battery is determined. $t_{USE}$ is estimated in step 226. More specifically, $t_{USE}$ is estimated based on the current SOC in view of the use profile information such as the usage percentage (UP) values and corresponding dSOC/dt (X) values. In step 228, it is determined whether $t_{USE}$ is less than a usage time threshold ($t_{USETHR}$). If $t_{USE}$ is less than $t_{USETHR}$, an elevated alert is provided to the user in step 230 and the process 220 ends. The elevated alert indicates $t_{USE}$ and/or a current SOC value, and also indicates that rate of discharge of the battery is greater than what would be normal for the current use profile. If $t_{USE}$ is not less than $t_{USETHR}$, a normal alert is provided in step 232 and the process 220 ends. The normal alert indicates $t_{USE}$ and/or a current SOC value to the user.

Referring now to FIG. 3, the exterior appearance of an exemplary device 300 that implements the usage time estimating and alerting is illustrated. In more detail, the hardware environment of the device 300 includes a display 301 for displaying text, images, and video to a user; a keyboard 302 for entering text data and user commands into the device 300; a pointing device 304 for pointing, selecting, and adjusting objects displayed on the display 301; an antenna 305; a network connection 306; a camera 307; a microphone 309; and a speaker 310. Although the device 300 shows an external antenna 305, the device 300 can include an internal antenna, which is not visible to the user.

The display 301 can display video, graphics, images, and text that make up the user interface for the software applications used by the device 300, and the operating system programs used to operate the device 300. Among the possible elements that may be displayed on the display 301 are a new mail indicator 311 that alerts a user to the presence of a new message; an active call indicator 312 that indicates that a telephone call is being received, placed, or is occurring; a data standard indicator 314 that indicates the data standard currently being used by the device 300 to transmit and receive data; a signal strength indicator 315 that indicates a measurement of the strength of a signal received by via the antenna 305, such as by using signal strength bars; a battery life indicator 316 that indicates a measurement of the remaining battery life; or a clock 317 that outputs the current time.

The display 301 may also show application icons representing various applications available to the user, such as a web browser application icon 319, a phone application icon 320, a search application icon 321, a contacts application icon 322, a mapping application icon 324, an email application icon 325, or other application icons. In one example implementation, the display 301 is a quarter video graphics array (QVGA) thin film transistor (TFT) liquid crystal display (LCD), capable of 16-bit or better color.

A user uses the keyboard (or "keypad") 302 to enter commands and data to operate and control the operating system and applications that provide for usage time estimating and alerting. The keyboard 302 includes standard keyboard buttons or keys associated with alphanumeric characters, such as keys 326 and 327 that are associated with the alphanumeric characters "Q" and "W" when selected alone, or are associated with the characters "*" and "1" when pressed in combination with key 329. A single key may also be associated with special characters or functions, including unlabeled functions, based upon the state of the operating system or applications invoked by the operating system. For example, when an application calls for the input of a numeric character, a selection of the key 327 alone may cause a "1" to be input.

In addition to keys traditionally associated with an alphanumeric keypad, the keyboard 302 also includes other special function keys, such as an establish call key 330 that causes a received call to be answered or a new call to be originated; a terminate call key 331 that causes the termination of an active call; a drop down menu key 332 that causes a menu to appear within the display 301; a backward navigation key 334 that causes a previously accessed network address to be accessed again; a favorites key 335 that causes an active web page to be placed in a bookmarks folder of favorite sites, or causes a bookmarks folder to appear; a home page key 336 that causes an application invoked on the device 300 to navigate to a predetermined network address; or other keys that provide for multiple-way navigation, application selection, and power and volume control.

The user uses the pointing device 304 to select and adjust graphics and text objects displayed on the display 301 as part of the interaction with and control of the device 300 and the applications invoked on the device 300. The pointing device 304 is any appropriate type of pointing device, and may be a joystick, a trackball, a touch-pad, a camera, a voice input device, a touch screen device implemented in combination with the display 301, or any other input device.

The antenna 305, which can be an external antenna or an internal antenna, is a directional or omni-directional antenna used for the transmission and reception of radiofrequency (RF) signals that implement point-to-point radio communication, wireless local area network (LAN) communication, or location determination. The antenna 305 may facilitate point-to-point radio communication using the Specialized Mobile Radio (SMR), cellular, or Personal Communication Service (PCS) frequency bands, and may implement the transmission of data using any number or data standards. For example, the antenna 305 may allow data to be transmitted between the device 300 and a base station using technologies such as Wireless Broadband (WiBro), Worldwide Interoperability for Microwave ACCess (WiMAX), 3GPP Long Term Evolution (LTE), Ultra Mobile Broadband (UMB), High Performance Radio Metropolitan Network (HIPERMAN), iBurst or High Capacity Spatial Division Multiple Access (HC-SDMA), High Speed OFDM Packet Access (HSOPA), High-Speed Packet Access (HSPA), HSPA Evolution, HSPA+, High Speed Upload Packet Access (HSUPA), High Speed Downlink Packet Access (HSDPA), Generic Access Network (GAN), Time Division-Synchronous Code Division Multiple Access (TD-SCDMA), Evolution-Data Optimized (or Evolution-Data Only) (EVDO), Time Division-Code Division Multiple Access (TD-CDMA), Freedom Of Mobile Multimedia Access (FOMA), Universal Mobile Telecommunications System (UMTS), Wideband Code Division Multiple Access (W-CDMA), Enhanced Data rates for GSM Evolution (EDGE), Enhanced GPRS (EGPRS), Code Division Multiple Access-2000 (CDMA2000), Wideband Integrated Dispatch Enhanced Network (WIDEN), High-Speed Circuit-Switched Data (HSCSD), General Packet Radio Service (GPRS), Personal Handy-Phone System (PHS), Circuit Switched Data (CSD), Personal Digital Cellular (PDC), CDMAone, Digital Advanced Mobile Phone System (D-AMPS), Integrated Digital Enhanced Network (IDEN), Global System for Mobile communications (GSM), DataTAC, Mobitex, Cellular Digital Packet Data (CDPD), Hicap, Advanced Mobile Phone System (AMPS), Nordic Mobile Phone (NMP), Autoradiopuhelin (ARP), Autotel or Public Automated Land Mobile (PALM), Mobiltelefonisystem D (MTD), Offentlig Landmobil Telefoni (OLT), Advanced Mobile Telephone System (AMTS), Improved Mobile Telephone Service (IMTS), Mobile Telephone System (MTS), Push-To-Talk (PTT), or other technologies. Communication via W-CDMA, HSUPA, GSM, GPRS, and EDGE networks may occur, for example, using a QUALCOMM MSM7200A chipset with an QUALCOMM RTR6285™ transceiver and PM7540™ power management circuit.

The wireless or wired computer network connection 306 may be a modem connection, a local-area network (LAN) connection including the Ethernet, or a broadband wide-area network (WAN) connection such as a digital subscriber line (DSL), cable high-speed internet connection, dial-up connection, T-1 line, T-3 line, fiber optic connection, or satellite connection. The network connection 306 may connect to a LAN network, a corporate or government WAN network, the Internet, a telephone network, or other network. The network connection 306 uses a wired or wireless connector. Example wireless connectors include, for example, an INFRARED DATA ASSOCIATION (IrDA) wireless connector, a WiFi wireless connector, an optical wireless connector, an INSTITUTE OF ELECTRICAL AND ELECTRONICS ENGINEERS (IEEE) Standard 802.11 wireless connector, a BLUETOOTH wireless connector (such as a BLUETOOTH version 1.2 or 3.0 connector), a near field communications (NFC) connector, an orthogonal frequency division multiplexing (OFDM) ultra wide band (UWB) wireless connector, a time-modulated ultra wide band (TM-UWB) wireless connector, or other wireless connector. Example wired connectors include, for example, a IEEE-1394 FIREWIRE connector, a Universal Serial Bus (USB) connector (including a mini-B USB interface connector), a serial port connector, a parallel port connector, or other wired connector. In another implementation, the functions of the network connection 306 and the antenna 305 are integrated into a single component.

The camera 307 allows the device 300 to capture digital images, and may be a scanner, a digital still camera, a digital video camera, other digital input device. In one example implementation, the camera 307 is a 3 mega-pixel (MP) camera that utilizes a complementary metal-oxide semiconductor (CMOS).

The microphone 309 allows the device 300 to capture sound, and may be an omni-directional microphone, a unidirectional microphone, a bi-directional microphone, a shotgun microphone, or other type of apparatus that converts sound to an electrical signal. The microphone 309 may be used to capture sound generated by a user, for example when the user is speaking to another user during a telephone call via the device 300. Conversely, the speaker 310 allows the device to convert an electrical signal into sound, such as a voice from another user generated by a telephone application program, or a ring tone generated from a ring tone application program. Furthermore, although the device 300 is illustrated in FIG. 3 as a handheld device, in further implementations the device 300 may be a laptop, a workstation, a midrange computer, a mainframe, an embedded system, telephone, desktop PC, a tablet computer, a PDA, or other type of computing device.

Figure 4:
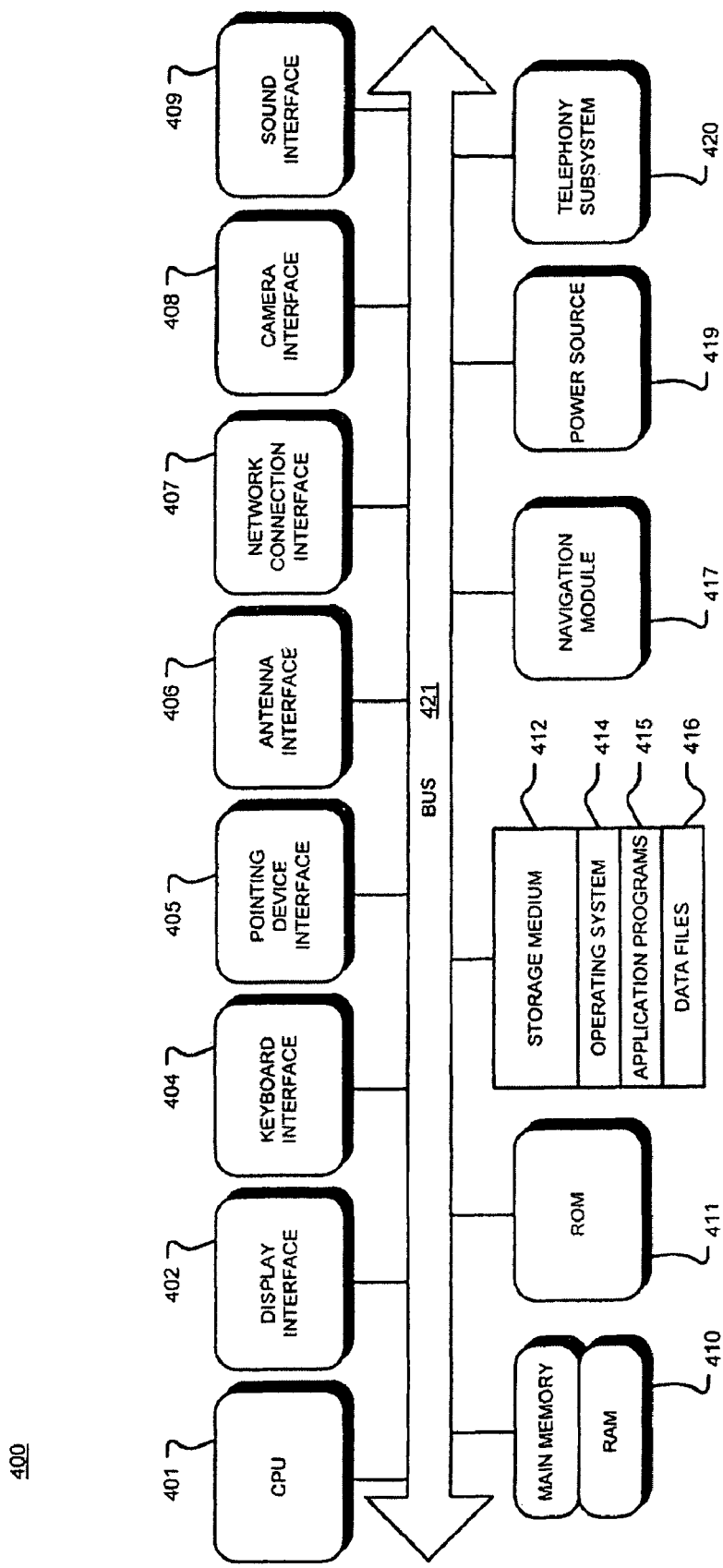
FIG. 4 is a block diagram illustrating the internal architecture of the device of FIG. 3.

FIG. 4 is a block diagram illustrating an internal architecture 400 of the device 300. The architecture includes a central processing unit (CPU) 401 where the computer instructions that comprise an operating system or an application are processed. The CPU 401 can include controllable power profiles, for speed scaling, for example, which enable the CPU 401 to operate more efficiently. The controllable power profile can feed into the user profile data that is collected, and/or can be controlled based on the user profile data. For example, the amount of battery life remaining can be fed back into the software that regulates operation of the CPU 401.

The architecture further includes a display interface 402 that provides a communication interface and processing functions for rendering video, graphics, images, and texts on the display 301, provides a set of built-in controls (such as buttons, text and lists), and supports diverse screen sizes; a keyboard interface 404 that provides a communication interface to the keyboard 302; a pointing device interface 405 that provides a communication interface to the pointing device 304; an antenna interface 406 that provides a communication interface to the antenna 305; a network connection interface 407 that provides a communication interface to a network over the computer network connection 306; a camera interface 408 that provides a communication interface and processing functions for capturing digital images from the camera 307; a sound interface 409 that provides a communication interface for converting sound into electrical signals using the microphone 309 and for converting electrical signals into sound using the speaker 310; a random access memory (RAM) 410 where computer instructions and data are stored in a volatile memory device for processing by the CPU 401; a read-only memory (ROM) 411 where invariant low-level systems code or data for basic system functions such as basic input and output (I/O), startup, or reception of keystrokes from the keyboard 302 are stored in a non-volatile memory device; a storage medium 412 or other suitable type of memory (e.g. such as RAM, ROM, programmable read-only memory (PROM), erasable programmable read-only memory (EPROM), electrically erasable programmable read-only memory (EEPROM), magnetic disks, optical disks, floppy disks, hard disks, removable cartridges, flash drives), where the files that comprise an operating system 414, application programs 415 (including, for example, a web browser application, a widget or gadget engine, and or other applications, as necessary) and data files 416 are stored; a navigation module 417 that provides a real-world or relative position or geographic location of the device 300; a power source 419 that provides an appropriate alternating current (AC) or direct current (DC) to power components; and a telephony subsystem 420 that allows the device 300 to transmit and receive sound over a telephone network. The constituent devices and the CPU 401 communicate with each other over a bus 421.

The CPU 401 can be one of a number of computer processors. In one arrangement, the computer CPU 401 is more than one processing unit. The RAM 410 interfaces with the computer bus 421 so as to provide quick RAM storage to the CPU 401 during the execution of software programs such as the operating system application programs, and device drivers. More specifically, the CPU 401 loads computer-executable process steps from the storage medium 412 or other media into a field of the RAM 410 in order to execute software programs. Data is stored in the RAM 410, where the data is accessed by the computer CPU 401 during execution. In one example configuration, the device 300 includes at least 128 MB of RAM, and 256 MB of flash memory.

The storage medium 412 itself may include a number of physical drive units, such as a redundant array of independent disks (RAID), a floppy disk drive, a flash memory, a USB flash drive, an external hard disk drive, thumb drive, pen drive, key drive, a High-Density Digital Versatile Disc (HD-DVD) optical disc drive, an internal hard disk drive, a Blu-Ray optical disc drive, or a Holographic Digital Data Storage (HDDS) optical disc drive, an external mini-dual in-line memory module (DIMM) synchronous dynamic random access memory (SDRAM), or an external micro-DIMM SDRAM. Such computer readable storage media allow the device 300 to access computer-executable process steps, application programs and the like, stored on removable and non-removable memory media, to off-load data from the device 300, or to upload data onto the device 300.

A computer program product is tangibly embodied in storage medium 412, a machine-readable storage medium. The computer program product includes instructions that, when read by a machine, operate to cause a data processing apparatus to store image data in the mobile device. In some implementations, the computer program product includes instructions that generate usage time estimating and alerting functionality, as described herein.

The operating system 414 may be a LINUX-based operating system such as the ANDROID mobile device platform; APPLE MAC OS X; MICROSOFT WINDOWS NT/WINDOWS 2000/WINDOWS XP/WINDOWS MOBILE; a variety of UNIX-flavored operating systems; or a proprietary operating system for computers or embedded systems. The application development platform, such as the ANDROID application development platform, or framework for the operating system 414 may be: BINARY RUNTIME ENVIRONMENT FOR WIRELESS (BREW); JAVA Platform, Micro Edition (JAVA ME) or JAVA 2 Platform, Micro Edition (J2ME) using the SUN MICROSYSTEMS JAVASCRIPT programming language; PYTHON™, FLASH LITE, or MICROSOFT .NET Compact, or another appropriate environment.

The device stores computer-executable code for the operating system 414, and the application programs 415 such as an email, instant messaging, a video service application, a mapping application word processing, spreadsheet, presentation, gaming, mapping, web browsing, JAVASCRIPT engine, or other applications. For example, one implementation may allow a user to access the GOOGLE GMAIL email application, the GOOGLE TALK instant messaging application, a YOUTUBE video service application, a GOOGLE MAPS or GOOGLE EARTH mapping application, or a GOOGLE PICASA imaging editing and presentation application. The application programs 415 may also include a widget or gadget engine, such as a TAFRI™ widget engine, a MICROSOFT gadget engine such as the WINDOWS SIDEBAR gadget engine or the KAPSULES™ gadget engine, a YAHOO! widget engine such as the KONFABULTOR™ widget engine, the APPLE DASHBOARD widget engine, the GOOGLE gadget engine, the KLIPFOLIO widget engine, an OPERA™ widget engine, the WIDSETS™ widget engine, a proprietary widget or gadget engine, or other widget or gadget engine the provides host system software for a physically-inspired applet on a desktop.

Although it is possible to provide for usage time estimating and alerting using the above-described implementation, it is also possible to implement the functions according to the present disclosure as a dynamic link library (DLL), or as a plug-in to other application programs such as an Internet web-browser such as the FOXFIRE web browser, the APPLE SAFARI web browser or the MICROSOFT INTERNET EXPLORER web browser.

The navigation module 417 may determine an absolute or relative position of the device, such as by using the Global Positioning System (GPS) signals, the GLObal NAvigation Satellite System (GLONASS), the Galileo positioning system, the Beidou Satellite Navigation and Positioning System, an inertial navigation system, a dead reckoning system, or by accessing address, internet protocol (IP) address, or location information in a database. The navigation module 417 may also be used to measure angular displacement, orientation, or velocity of the device 300, such as by using one or more accelerometers. Another source of location data can include cellular towers in range of the mobile device.

Figure 5:
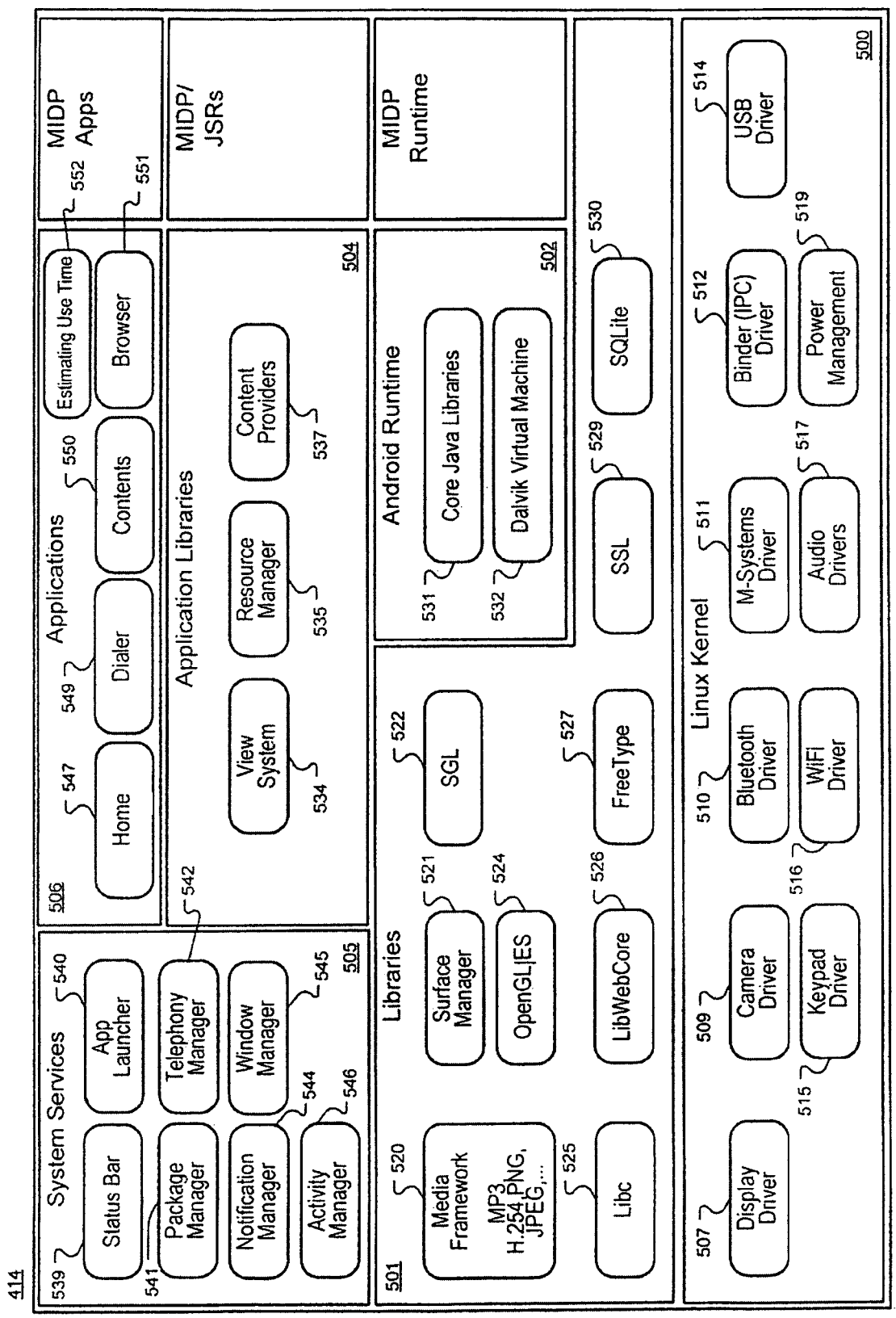
FIG. 5 is a block diagram illustrating exemplary components of the operating system used by the device of FIG. 3.

FIG. 5 is a block diagram illustrating exemplary components of the operating system 414 used by the device 300, in the case where the operating system 414 is the GOOGLE mobile device platform. The operating system 414 invokes multiple processes, while ensuring that the associated phone application is responsive, and that wayward applications do not cause a fault (or "crash") of the operating system. Using task switching, the operating system 414 allows for the switching of applications while on a telephone call, without losing the state of each associated application. The operating system 414 may use an application framework to encourage reuse of components, and provide a scalable user experience by combining pointing device and keyboard inputs and by allowing for pivoting. Thus, the operating system can provide a rich graphics system and media experience, while using an advanced, standards-based web browser.

The operating system 414 can generally be organized into six components: a kernel 500, libraries 501, an operating system runtime 502, application libraries 504, system services 505, and applications 506. The kernel 500 includes a display driver 507 that allows software such as the operating system 414 and the application programs 515 to interact with the display 301 via the display interface 402, a camera driver 509 that allows the software to interact with the camera 307; a BLUETOOTH driver 510; a M-Systems driver 511; a binder (IPC) driver 512, a USB driver 514 a keypad driver 515 that allows the software to interact with the keyboard 302 via the keyboard interface 404; a WiFi driver 516; audio drivers 517 that allow the software to interact with the microphone 309 and the speaker 310 via the sound interface 409; and a power management component 519 that allows the software to interact with and manage the power source 519.

The BLUETOOTH driver, which in one implementation is based on the BlueZ BLUETOOTH stack for LINUX-based operating systems, provides profile support for headsets and hands-free devices, dial-up networking, personal area networking (PAN), or audio streaming (such as by Advance Audio Distribution Profile (A2DP) or Audio/Video Remote Control Profile (AVRCP). The BLUETOOTH driver provides JAVA bindings for scanning, pairing and unpairing, and service queries.

The libraries 501 include a media framework 520 that supports standard video, audio and still-frame formats (such as Moving Picture Experts Group (MPEG)-4, H.264, MPEG-1 Audio Layer-3 (MP3), Advanced Audio Coding (AAC), Adaptive Multi-Rate (AMR), Joint Photographic Experts Group (JPEG), and others) using an efficient JAVA Application Programming Interface (API) layer; a surface manager 521; a simple graphics library (SGL) 522 for two-dimensional application drawing; an Open Graphics Library for Embedded Systems (OpenGL ES) 524 for gaming and three-dimensional rendering; a C standard library (LIBC) 525; a LIBWEBCORE library 526; a FreeType library 527; an SSL 529; and an SQLite library 530.

The operating system runtime 502 includes core JAVA libraries 531, and a Dalvik virtual machine 532. The Dalvik virtual machine 532 is a custom, virtual machine that runs a customized file format (.DEX).

The operating system 414 can also include Mobile Information Device Profile (MIDP) components such as the MIDP JAVA Specification Requests (JSRs) components, MIDP runtime, and MIDP applications as shown in FIG. 5. The MIDP components can support MIDP applications running on the device 300.

With regard to graphics rendering, a system-wide composer manages surfaces and a frame buffer and handles window transitions, using the OpenGL ES 524 and two-dimensional hardware accelerators for its compositions.

The Dalvik virtual machine 532 may be used with an embedded environment, since it uses runtime memory very efficiently, implements a CPU-optimized bytecode interpreter, and supports multiple virtual machine processes per device. The custom file format (.DEX) is designed for runtime efficiency, using a shared constant pool to reduce memory, read-only structures to improve cross-process sharing, concise, and fixed-width instructions to reduce parse time, thereby allowing installed applications to be translated into the custom file formal at build-time. The associated bytecodes are designed for quick interpretation, since register-based instead of stack-based instructions reduce memory and dispatch overhead, since using fixed width instructions simplifies parsing, and since the 16-bit code units minimize reads.

The application libraries 504 include a view system 534, a resource manager 535, and content providers 537. The system services 505 includes a status bar 539; an application launcher 540; a package manager 541 that maintains information for all installed applications; a telephony manager 542 that provides an application level JAVA interface to the telephony subsystem 420; a notification manager 544 that allows all applications access to the status bar and on-screen notifications; a window manager 545 that allows multiple applications with multiple windows to share the display 301; and an activity manager 546 that runs each application in a separate process, manages an application life cycle, and maintains a cross-application history.

The applications 506 include a home application 547, a dialer application 549, a contacts application 550, a browser application 551, and usage time estimating and alerting application 552.

The telephony manager 542 provides event notifications (such as phone state, network state, Subscriber Identity Module (SIM) status, or voicemail status), allows access to state information (such as network information, SIM information, or voicemail presence), initiates calls, and queries and controls the call state. The browser application 551 renders web pages in a full, desktop-like manager, including navigation functions. Furthermore, the browser application 551 allows single column, small screen rendering, and provides for the embedding of HTML views into other applications.

Figure 6:
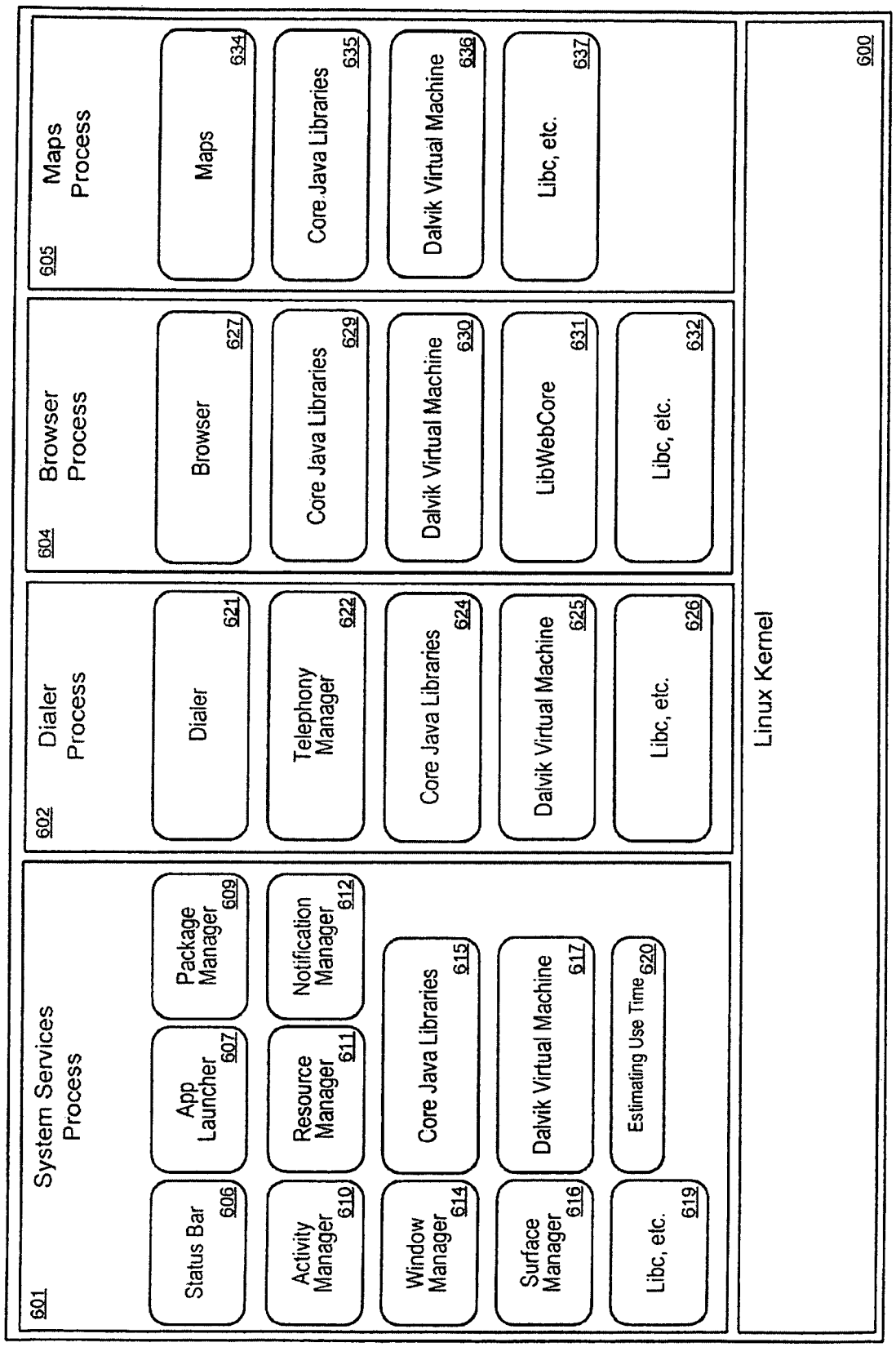
FIG. 6 is a block diagram illustrating exemplary processes implemented by the operating system kernel of FIG. 5.

FIG. 6 is a block diagram illustrating exemplary processes implemented by the operating system kernel 600. Generally, applications and system services run in separate processes, where the activity manager 546 runs each application in a separate process and manages the application life cycle. The applications run in their own processes, although many activities or services can also run in the same process. Processes are started and stopped as needed to run an application's components, and processes may be terminated to reclaim resources. Each application is assigned its own process, whose name is the application's package name, and individual parts of an application can be assigned another process name.

Some processes can be persistent. For example, processes associated with core system components such as the surface manager 616, the window manager 614, or the activity manager 610 can be continuously executed while the device 300 is powered. Additionally, some application-specific process can also be persistent. For example, processes associated with the dialer application 621, may also be persistent.

The processes implemented by the operating system kernel 600 may, generally be categorized as system services processes 601, dialer processes 602, browser processes 604, and maps processes 605. The system services processes 601 include status bar processes 606 associated with the status bar 539; application launcher processes 607 associated with the application launcher 540; package manager processes 609 associated with the package manager 541; activity manager processes 610 associated with the activity manager 546; resource manager processes 611 associated with a resource manager 611 that provides access to graphics, localized strings, and XML layout descriptions; notification manger processes 612 associated with the notification manager 544; window manager processes 614 associated with the window manager 545; core JAVA libraries processes 615 associated with the core JAVA libraries 531; surface manager processes 616 associated with the surface manager 521; Dalvik virtual machine processes 617 associated with the Dalvik virtual machine 532, LIBC processes 619 associated with the LIBC library 525; and usage time estimating and alerting processes 620 associated with the usage time estimating and alerting application 552.

The dialer processes 602 include dialer application processes 621 associated with the dialer application 549; telephony manager processes 622 associated with the telephony manager 542; core JAVA libraries processes 624 associated with the core JAVA libraries 531; Dalvik virtual machine processes 625 associated with the Dalvik Virtual machine 532; and LIBC processes 626 associated with the LIBC library 525. The browser processes 604 include browser application processes 627 associated with the browser application 551; core JAVA libraries processes 629 associated with the core JAVA libraries 531; Dalvik virtual machine processes 630 associated with the Dalvik virtual machine 532; LIBWEBCORE processes 631 associated with the LIBWEBCORE library 526; and LIBC processes 632 associated with the LIBC library 525.

The maps processes 605 include maps application processes 634, core JAVA libraries processes 635, Dalvik virtual machine processes 636, and LIBC processes 637. Notably, some processes, such as the Dalvik virtual machine processes, may exist within one or more of the systems services processes 601, the dialer processes 602, the browser processes 604, and the maps processes 605.

Figure 7:
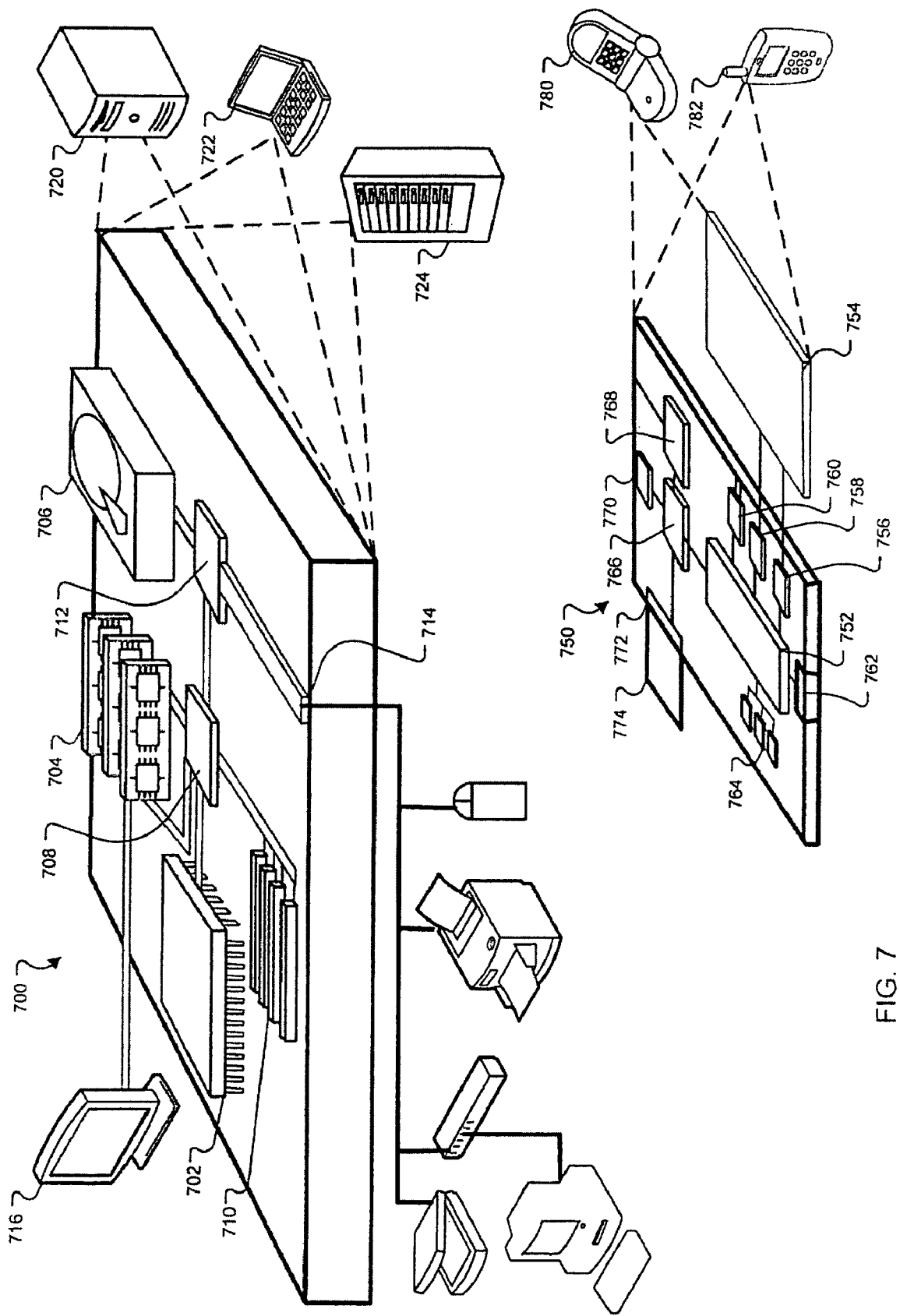
FIG. 7 shows an example of a computer device and a mobile computer device that can be used to implement the techniques described here.

FIG. 7 shows an example of a generic computer device 700 and a generic mobile computer device 750, which may be used with the techniques described here. Computing device 700 is intended to represent various forms of digital computers, such as laptops, desktops, workstations, personal digital assistants, servers, blade servers, mainframes, and other appropriate computers. Computing device 750 is intended to represent various forms of mobile devices, such as personal digital assistants, cellular telephones, smartphones, and other similar computing devices. The components shown here, their connections and relationships, and their functions, are meant to be exemplary only, and are not meant to limit implementations of the inventions described and/or claimed in this document.

Computing device 700 includes a processor 702, memory 704, a storage device 706, a high-speed interface 708 connecting to memory 704 and high-speed expansion ports 710, and a low speed interface 712 connecting to low speed bus 714 and storage device 706. Each of the components 702, 704, 706, 708, 710, and 712, are interconnected using various busses, and may be mounted on a common motherboard or in other manners as appropriate. The processor 702 can process instructions for execution within the computing device 700, including instructions stored in the memory 704 or on the storage device 706 to display graphical information for a GUI on an external input/output device, such as display 716 coupled to high speed interface 708. In other implementations, multiple processors and/or multiple buses may be used, as appropriate, along with multiple memories and types of memory. Also, multiple computing devices 700 may be connected, with each device providing portions of the necessary operations (e.g., as a server bank, a group of blade servers, or a multi-processor system).

The memory 704 stores information within the computing device 700. In one implementation, the memory 704 is a volatile memory unit or units. In another implementation, the memory 704 is a non-volatile memory unit or units. The memory 704 may also be another form of computer-readable medium, such as a magnetic or optical disk.

The storage device 706 is capable of providing mass storage for the computing device 700. In one implementation, the storage device 706 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier is a computer- or machine-readable medium, such as the memory 704, the storage device 706, memory on processor 702, or a propagated signal.

The high speed controller 708 manages bandwidth-intensive operations for the computing device 700, while the low speed controller 712 manages lower bandwidth-intensive operations. Such allocation of functions is exemplary only. In one implementation, the high-speed controller 708 is coupled to memory 704, display 716 (e.g., through a graphics processor or accelerator), and to high-speed expansion ports 710, which may accept various expansion cards (not shown). In the implementation, low-speed controller 712 is coupled to storage device 706 and low-speed expansion port 714. The low-speed expansion port, which may include various communication ports (e.g., USB, Bluetooth, Ethernet, wireless Ethernet) may be coupled to one or more input/output devices, such as a keyboard, a pointing device, a scanner, or a networking device such as a switch or router, e.g., through a network adapter.

The computing device 700 may be implemented in a number of different forms, as shown in the figure. For example, it may be implemented as a standard server 720, or multiple times in a group of such servers. It may also be implemented as part of a rack server system 724. In addition, it may be implemented in a personal computer such as a laptop computer 722. Alternatively, components from computing device 700 may be combined with other components in a mobile device (not shown), such as device 750. Each of such devices may contain one or more of computing device 700, 750, and an entire system may be made up of multiple computing devices 700, 750 communicating with each other.

Computing device 750 includes a processor 752, memory 764, an input/output device such as a display 754, a communication interface 766, and a transceiver 768, among other components. The device 750 may also be provided with a storage device, such as a microdrive or other device, to provide additional storage. Each of the components 750, 752, 764, 754, 766, and 768, are interconnected using various buses, and several of the components may be mounted on a common motherboard or in other manners as appropriate.

The processor 752 can execute instructions within the computing device 750, including instructions stored in the memory 764. The processor may be implemented as a chipset of chips that include separate and multiple analog and digital processors. The processor may provide, for example, for coordination of the other components of the device 750, such as control of user interfaces, applications run by device 750, and wireless communication by device 750.

Processor 752 may communicate with a user through control interface 758 and display interface 756 coupled to a display 754. The display 754 may be, for example, a TFT LCD (Thin-Film-Transistor Liquid Crystal Display) or an OLED (Organic Light Emitting Diode) display, or other appropriate display technology. The display interface 756 may comprise appropriate circuitry for driving the display 754 to present graphical and other information to a user. The control interface 758 may receive commands from a user and convert them for submission to the processor 752. In addition, an external interface 762 may be provide in communication with processor 752, so as to enable near area communication of device 750 with other devices. External interface 762 may provide, for example, for wired communication in some implementations, or for wireless communication in other implementations, and multiple interfaces may also be used.

The memory 764 stores information within the computing device 750. The memory 764 can be implemented as one or more of a computer-readable medium or media, a volatile memory unit or units, or a non-volatile memory unit or units. Expansion memory 774 may also be provided and connected to device 750 through expansion interface 772, which may include, for example, a SIMM (Single In Line Memory Module) card interface. Such expansion memory 774 may provide extra storage space for device 750, or may also store applications or other information for device 750. Specifically, expansion memory 774 may include instructions to carry out or supplement the processes described above, and may include secure information also. Thus, for example, expansion memory 774 may be provide as a security module for device 750, and may be programmed with instructions that permit secure use of device 750. In addition, secure applications may be provided via the SIMM cards, along with additional information, such as placing identifying information on the SIMM card in a non-hackable manner.

The memory may include, for example, flash memory and/or NVRAM memory, as discussed below. In one implementation, a computer program product is tangibly embodied in an information carrier. The computer program product contains instructions that, when executed, perform one or more methods, such as those described above. The information carrier is a computer- or machine-readable medium, such as the memory 764, expansion memory 774, memory on processor 752, or a propagated signal that may be received, for example, over transceiver 768 or external interface 762.

Device 750 may communicate wirelessly through communication interface 766, which may include digital signal processing circuitry where necessary. Communication interface 766 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 768. In addition, short-range communication may occur, such as using a Bluetooth, WiFi, or other such transceiver (not shown). In addition, GPS (Global Positioning System) receiver module 770 may provide additional navigation- and location-related wireless data to device 750, which may be used as appropriate by applications running on device 750.

Device 750 may also communicate audibly using audio codec 760, which may receive spoken information from a user and convert it to usable digital information. Audio codec 760 may likewise generate audible sound for a user, such as through a speaker, e.g., in a handset of device 750. Such sound may include sound from voice telephone calls, may include recorded sound (e.g., voice messages, music files, etc.) and may also include sound generated by applications operating on device 750.

The computing device 750 may be implemented in a number of different forms, as shown in the figure. For example, it may be implemented as a cellular telephone 780. It may also be implemented as part of a smartphone 782, personal digital assistant, or other similar mobile device.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

A number of implementations have been described. Nevertheless, it will be understood that various modifications may be made without departing from the spirit and scope of the invention. In addition, the logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A method of estimating a remaining use time of a battery of a mobile device, the method comprising:
   providing a use profile programmed in a memory of the mobile device;
   monitoring a rate of change of a state of charge (SOC) of the battery;
   processing the rate of change of SOC and the use profile to effect a comparison therebetween; and
   estimating the remaining use time based on the comparison.

2. The method of claim 1, further comprising:
   determining a usage category of the mobile device corresponding to the use profile;
   determining the rate of change of SOC associated with the usage category;
   calculating an amount of time that the mobile device is operating in the usage category; and
   updating a baseline use percentage value of the usage category based on the rate of change of SOC and the amount of time.

3. The method of claim 2, wherein the baseline use percentage value is updated based on pro-rated rate of change of SOC values, when the mobile device is operating in concurrent usage categories.

4. The method of claim 1, further comprising:
   comparing the remaining use time to a threshold time; and
   providing a normal alert when the remaining use time is greater than the threshold time.

5. The method of claim 4, further comprising providing an increased alert when the remaining use time is not greater than the threshold time.

6. The method of claim 1, further comprising selecting the use profile from a plurality of use profiles.

7. The method of claim 6, further comprising monitoring use of the mobile device, wherein the use profile is automatically selected by the mobile device based on the use of the mobile device.

8. The method of claim 6, wherein the use profile is selected based on a user input.

9. A system for estimating a remaining use time of a battery of a mobile device, the system comprising:
   means for providing a use profile programmed in a memory of the mobile device;
   means for monitoring a rate of change of a state of charge (SOC) of the battery;
   means for processing the rate of change of SOC and the use profile to effect a comparison therebetween; and
   means for estimating the remaining use time based on the comparison.

10. The system of claim 9, further comprising:
    means for determining a usage category of the mobile device corresponding to the use profile;
    means for determining the rate of change of SOC associated with the usage category;

means for calculating an amount of time that the mobile device is operating in the usage category; and means for updating a baseline use percentage value of the usage category based on the rate of change of SOC and the amount of time.

11. The system of claim 10, wherein the baseline use percentage value is updated based on pro-rated rate of change of SOC values, when the mobile device is operating in concurrent usage categories.

12. The system of claim 9, further comprising:

means for comparing the remaining use time to a threshold time; and means for providing a normal alert when the remaining use time is greater than the threshold time.

13. The system of claim 12, further comprising means for providing an increased alert when the remaining use time is not greater than the threshold time.

14. The system of claim 9, further comprising means for selecting the use profile from a plurality of use profiles.

15. The system of claim 14, further comprising means for monitoring use of the mobile device, wherein the use profile is automatically selected by the mobile device based on the use of the mobile device.

16. The system of claim 14, wherein the use profile is selected based on a user input.

17. A mobile device that is powered by a battery, the mobile device comprising:

a memory for storing a use profile programmed in a memory of the mobile device; and a processor that monitors a rate of change of a state of charge (SOC) of the battery, that processes the rate of change of SOC and the use profile to effect a comparison therebetween, and that estimates a remaining use time of the mobile device based on the comparison.

18. The mobile device of claim 17, wherein the processor determines a usage category of the mobile device corresponding to the use profile, determines the rate of change of SOC associated with the usage category, calculates an amount of time that the mobile device is operating in the usage category, and updates a baseline use percentage value of the usage category based on the rate of change of SOC and the amount of time.

19. The mobile device of claim 18, wherein the baseline use percentage value is updated based on pro-rated rate of change of SOC values, when the mobile device is operating in concurrent usage categories.

20. The mobile device of claim 17, wherein the processor compares the remaining use time to a threshold time, and provides a normal alert when the remaining use time is greater than the threshold time.

21. The mobile device of claim 20, wherein the processor provides an increased alert when the remaining use time is not greater than the threshold time.

22. The mobile device of claim 17, wherein the processor selects the use profile from a plurality of use profiles stored in the memory.

23. The mobile device of claim 22, wherein the processor monitors use of the mobile device, and automatically selects the use profile based on the use of the mobile device.

24. The mobile device of claim 22, wherein the processor selects the use profile based on a user input.

25. A method of estimating a remaining use time of a battery of a mobile device, the method comprising:

selecting a use profile from a plurality of use profiles programmed in a memory of the mobile device;

monitoring a rate of change of a state of charge (SOC) of the battery;

processing the rate of change of SOC and the use profile to effect a comparison therebetween;

estimating the remaining use time based on the comparison;

determining a usage category of the mobile device corresponding to the use profile;

determining the rate of change of SOC associated with the usage category;

calculating an amount of time that the mobile device is operating in the usage category; and updating a baseline use percentage value of the usage category based on the rate of change of SOC and the amount of time.

* * * * *